(12) United States Patent
Baek et al.

(10) Patent No.: US 8,092,598 B2
(45) Date of Patent: Jan. 10, 2012

(54) APPARATUS AND METHOD FOR THIN FILM DEPOSITION

(75) Inventors: Yong-Ku Baek, Seoul (KR); Seung-Hoon Lee, Seoul (KR)

(73) Assignee: Fusionaid Co., Ltd., Paju-si (KR)

( * ) Notice: Subject to any disclaimer, the term of this patent is extended or adjusted under 35 U.S.C. 154(b) by 1182 days.

(21) Appl. No.: 10/559,944

(22) PCT Filed: Jul. 20, 2005

(86) PCT No.: PCT/KR2005/002336
§ 371 (c)(1),
(2), (4) Date: Dec. 8, 2005

(87) PCT Pub. No.: WO2006/065014
PCT Pub. Date: Jun. 22, 2006

(65) Prior Publication Data
US 2007/0095286 A1 May 3, 2007

(30) Foreign Application Priority Data
Dec. 16, 2004 (KR) .................. 10-2004-0106963

(51) Int. Cl.
*C23C 16/00* (2006.01)
(52) U.S. Cl. ............... 118/715; 156/345.33; 156/345.34
(58) Field of Classification Search ............ 118/715; 156/345.33, 345.34
See application file for complete search history.

(56) References Cited

U.S. PATENT DOCUMENTS

| | | | | |
|---|---|---|---|---|
| 5,186,756 A | * | 2/1993 | Benko et al. | 118/730 |
| 5,223,001 A | * | 6/1993 | Saeki | 29/25.01 |
| 5,281,274 A | * | 1/1994 | Yoder | 118/697 |
| 5,884,009 A | * | 3/1999 | Okase | 392/418 |
| 6,132,512 A | * | 10/2000 | Horie et al. | 118/715 |
| 6,156,151 A | * | 12/2000 | Komino et al. | 156/345.29 |
| 6,183,564 B1 | * | 2/2001 | Reynolds et al. | 118/719 |
| 6,576,062 B2 | | 6/2003 | Matsuse | |
| 6,634,314 B2 | * | 10/2003 | Hwang et al. | 118/723 R |
| 6,656,284 B1 | | 12/2003 | Hwang et al. | |
| 6,769,629 B2 | | 8/2004 | Hwang et al. | |
| 6,821,563 B2 | * | 11/2004 | Yudovsky | 427/248.1 |

(Continued)

FOREIGN PATENT DOCUMENTS

JP 2002-324760 * 11/2002

(Continued)

*Primary Examiner* — Ram Kackar
*Assistant Examiner* — Satish Chandra
(74) *Attorney, Agent, or Firm* — Schmeiser, Olsen & Watts LLP

(57) ABSTRACT

Disclosed herein is a thin film deposition apparatus having a reaction chamber for forming a thin film on a plurality of substrates rested on a susceptor. The apparatus comprises: a gas supply means for supplying a plurality of gases to the inside of the reaction chamber from the outside, the gases including a reaction gas; a gas distribution means for distributing and spraying the gases supplied from the gas supply means so as to conform to the purpose of a process; a gas retaining means having a plurality of reaction cells for partitionally accommodating and retaining the respective gases distributed from the gas distribution means; a rotation driving means for rotating the gas retaining means such that the gases retained in the respective reaction cells are exposed to the substrates in sequence; and a gas exhaust means for pumping the gases retained by the gas retaining means to the outside of the reaction chamber.

18 Claims, 7 Drawing Sheets

U.S. PATENT DOCUMENTS

| | | | |
|---|---|---|---|
| 6,929,830 B2 * | 8/2005 | Tei et al. | 427/575 |
| 2003/0041971 A1 * | 3/2003 | Kido et al. | 156/345.33 |
| 2004/0082171 A1 * | 4/2004 | Shin et al. | 438/689 |
| 2005/0017100 A1 * | 1/2005 | Watanabe et al. | 239/596 |
| 2005/0167052 A1 * | 8/2005 | Ishihara et al. | 156/345.47 |
| 2005/0224181 A1 * | 10/2005 | Merry et al. | 156/345.35 |
| 2006/0000412 A1 * | 1/2006 | Ahn et al. | 118/715 |

FOREIGN PATENT DOCUMENTS

| | | | |
|---|---|---|---|
| KR | 10-2003-0086056 | * | 11/2003 |
| KR | 2003-86056 | | 11/2003 |

* cited by examiner

APPARATUS AND METHOD FOR THIN FILM DEPOSITION

BACKGROUND OF THE INVENTION

1. Field of the Invention

The present invention relates to an apparatus for and a method of depositing a thin film, and more particularly to an apparatus for and a method of depositing a thin film, in which, dissimilar to a conventional technology where a gas supply and exhaust are repeated through the operation of a valve and a pump installed in a reaction chamber, a gas is continuously supplied to the inside of the reaction chamber, and the supplied gas is exposed to respective substrates through a plurality of separate reaction cells and simultaneously excessive gases are continuously exhausted, thereby improving reaction rate and characteristics.

2. Background of the Related Art

In general, semiconductor manufacturing processes employ a sputtering, chemical vapor deposition, atomic layer deposition method to thereby form a uniform thin film.

Among these thin film deposition methods, the chemical vapor deposition method has been most widely used. In this method, using a reaction gas and a decomposition gas, a thin film having a required thickness is deposited on a substrate. In the chemical vapor deposition method, first, various gases are injected into a reaction chamber, and the gases derived by a high energy such as heat, light, plasma are chemically reacted to thereby form a thin film having a desired thickness. In addition, the reaction conditions are controlled through the ratio and amount of plasma or gases applied as much as reaction energy, thus improving the deposition rate thereof. However, the reactions occur fast and thus it is very difficult to control the thermodynamic stability of atoms.

In the atomic layer deposition method, a reaction gas and a purge gas are alternately supplied to deposit an atomic layer. The formed thin film has good film characteristics and can be applied to a large-diameter substrate and an electrode thin film. In addition, this thin film has a good electrical and physical property. In general, in the atomic layer deposition method, first, a first reaction gas is supplied to chemically adsorb a single layer of first source on the surface of a substrate and excessive physically adsorbed sources are purged by flowing a purge gas. Thereafter, a second reaction gas is supplied to the single layered source to chemically react the single layer first source with the second reaction gas to deposit an intended atomic layer and excessive gas is purged by flowing a purge gas. These steps constitute one cycle of process step for forming a thin film.

As described above, the atomic layer deposition method employs a surface reaction mechanism and thus provides a stable and uniform thin film. In addition, in the atomic layer deposition method, reaction gases are separately supplied and purged in sequence, and thus particle formation can be suppressed through gaseous phase reaction, as compared with the chemical vapor deposition method.

In the case where a thin film is deposited through the above atomic layer deposition method, the deposition occurs through the materials adsorbed on the surface of a substrate (generally, chemical molecules containing the film elements). At this time, generally, the adsorption is self-limited on the substrate, and thus uniformly obtained over the entire substrate, without largely relying on the amount of supplied gas (the amount of reaction gas).

Therefore, a uniform thickness film can be obtained even in stepped portions having a very high aspect ratio, regardless of positions. Even in a case of a thin film having a thickness of a few nanometer, the thickness thereof can be easily controlled. In addition, since the thickness of the thin film is in proportion to the gas supply period in the process, the thickness thereof can be adjusted by controlling the frequency of gas supply periods.

The conventional atomic layer deposition apparatus implementing the above-described atomic layer deposition technique will be described, referring to FIGS. 1 and 2. FIG. 1 is a schematic diagram showing the structure of a conventional shower head type atomic layer thin film deposition apparatus.

FIG. 2 is a schematic diagram showing the structure of a conventional layer behavior type atomic layer thin film deposition apparatus. For the convenience of explanation, like components are denoted by like reference numerals.

First, as shown in FIG. 1, the conventional shower head type atomic layer deposition apparatus includes a reaction chamber 1 having a reaction furnace 2 where a reaction gas and purge gas is supplied in sequence and an atomic layer is deposited on a substrate 3 and connected to a pumping means for discharging supplied gas to the outside; a substrate chuck 4 provided below the reaction chamber 1 and where the substrate 3 is rested; a shower head type gas supplier 5 provided above the reaction chamber 1 facing the substrate chuck 4 and for spraying gas towards the reaction chamber 2; valves 6, 7, 8 and 9 provided on the supply path of the reaction gas supplier 5 and for opening and closing the gas supply.

Here, reference numeral 6 denotes a first reaction gas valve, 7 denotes a purge gas valve, 8 denotes a second reaction gas valve, and 9 denotes a purge gas valve.

Next, as shown in FIG. 2, the conventional layer behavior type atomic layer thin film deposition apparatus includes a reaction chamber 1 having a reaction furnace 2 where a reaction gas and a purge gas are supplied in sequence to deposit an atomic layer; a substrate chuck 4 provided below the reaction chamber 1 to allow a substrate 3 to be rested thereon; and valves 6, 7, 8 and 9 provided respectively in gas supply tubes connected so as to provide a layered form of gas to the reaction chamber 1. Here, the reaction chamber 1 is connected with a pumping means for discharging gas supplied to the reaction furnace 2 to the outside.

In the conventional apparatus having the above-described apparatuses, the reaction gas valve 6 and 8 and the purge gas valve 7 and 9 must be opened and closed every time when one cycle of operation is performed, thus shortening the service life thereof according to the service life of valves. In addition, the time for an appropriate amount of gas to reach the substrate 3 is delayed, due to the valve driving electrical signal associated with the valve operation, a time delay caused during air driving, and conductance generated in the narrow gas tubes.

In addition, since the reaction chamber 1 has a small volume for the purpose of speedy replacement of gas in the reaction chamber 1, the number of the substrate 3 capable of being mounted in the reaction chamber 1 is limited, thus leading to a decreased productivity in mass production.

On the other hand, in a conventional thin film deposition apparatus, plasma is directly excited in a reaction chamber in order to the reaction rate and the reaction characteristics in the atomic layer deposition reaction.

The above apparatus, as shown in FIG. 3, includes a plasma generator 10 for exciting plasma in a reaction furnace 2 inside a reaction chamber 1 and having a switch 11 for on and off of an RF power. In order for an atomic layer to be deposited, an RF power is to be applied, coincidentally when a selected reaction gas is introduced into the reaction chamber and exposed to the substrate 3.

In this case, problematically, the speed of the reaction gas reaching the substrate 3 is not coincident with the electrical transmission speed of the RF power. In addition, each process step is carried out in a short period of time and thus the reaction gas in the previous step is not completely removed. At this state, if a plasma is formed, a thin film comes to have a large content of impurities, thus degrading the characteristics of the thin film.

In addition, since the plasma is to be excited when the selected reaction gas is introduced, the RF power must be applied at a determined step only. Thus, in order to apply the RF power at a determined step only, on/off of the RF power must be repeated. Therefore, the RF generator for generating the RF power and the RF matching network for stabilizing plasma have a shortened service life, and the plasma formed without a stabilization time has a decreased efficiency and the atomic layer deposition reaction becomes unstable disadvantageously.

On the other hand, FIG. 4 shows a conventional thin film deposition apparatus employing a radical generator 12 capable of forming radicals on the line supplying one reaction gas. As shown in FIG. 4, in the apparatus of FIG. 4, a selected reaction gas is supplied and accumulated inside the radical generator 12 for a short period of time in order to form radicals in an external device and apply the reaction furnace, and, when a valve 13 is opened, the produced radicals are transferred to the reaction furnace 2 simultaneously.

In the case where the above-described radical generator is employed, the radicalized reaction gas is transferred to the reaction furnace through a separate valve 13, and thus the internal pressure of the reaction furnace 2 becomes unstable, in addition to the problems with durability associated with valve switching and time delay in the apparatus of FIG. 3.

SUMMARY OF THE INVENTION

Accordingly, the present invention has been made to solve the above-described problems occurring in the prior art, and it is an object of the present invention to provide an apparatus for and a method of depositing a thin film, in which, dissimilar to a conventional technology where a gas supply and exhaust are repeated through the operation of a valve and a pump installed in a reaction chamber, a gas is continuously supplied to the inside of the reaction chamber and the supplied gases are retained in a plurality of separate reaction cells, and the substrates are exposed to the retained gas in sequence and simultaneously excessive gases are continuously exhausted, thereby improving reaction rate and characteristics.

Another object of the invention is to provide an apparatus for and a method of depositing a thin film, which can continuously plasma-excite a desired reaction gas so as to conform to the purpose of a process and simultaneously or selectively radicalize a desired reaction gas, thus improving reaction rate and characteristics.

To achieve the above object, in one aspect, the present invention provides a thin film deposition apparatus having a reaction chamber for forming a thin film on a plurality of substrates rested on a susceptor. The apparatus of the invention comprises: a gas supply means for supplying a plurality of gases to the inside of the reaction chamber from the outside, the gases including a reaction gas; a gas distribution means for distributing and spraying the gases supplied from the gas supply means so as to conform to the purpose of a process; a gas retaining means having a plurality of reaction cells for partitionally accommodating and retaining the respective gases distributed from the gas distribution means; a rotation driving means for rotating the gas retaining means such that the gases retained in the respective reaction cells are exposed to the substrates in sequence; and a gas exhaust means for pumping the gases retained by the gas retaining means to the outside of the reaction chamber.

To achieve the above object, in another aspect, the present invention provides a thin film deposition apparatus having a reaction chamber for forming a thin film on a plurality of substrates rested on a susceptor. The apparatus of the invention comprises: a gas supply means for supplying a plurality of gases to the inside of the reaction chamber from the outside, the gases including a reaction gas; a gas distribution means for distributing and spraying the gases supplied from the gas supply means so as to conform to the purpose of a process; a gas retaining means having a plurality of reaction cells for partitionally accommodating and retaining the respective gases distributed from the gas distribution means, the gas retaining means being connected at its central portion with the lower end of the gas distribution mean; a rotation driving means for rotating the gas retaining means such that the gases retained in the respective reaction cells are exposed to the substrates in sequence, the reaction cell being integrally rotated together with the gas distribution means; and a gas exhaust means for pumping the gases retained by the gas retaining means to the outside of the reaction chamber.

To achieve the above object, in another aspect, the present invention provides a thin film deposition apparatus having a reaction chamber for forming an atomic layer on a plurality of substrates rested on a susceptor. The apparatus of the invention comprises: a gas supply means for supplying two or more reaction gases (a first reaction gas, a second reaction gas) and a purge gas to the inside of the reaction chamber from the outside, the gases including a reaction gas; a gas distribution means for distributing and spraying the gases supplied from the gas supply means, in the order of the first reaction gas, the purge gas, the second reaction gas, the purge gas; a gas retaining means having a plurality of reaction cells for partitionally accommodating and retaining the respective gases distributed from the gas distribution means; a rotation driving means for rotating the gas retaining means such that the gases retained in the respective reaction cells are exposed to the substrates in sequence; and a gas exhaust means for pumping the gases retained by the gas retaining means to the outside of the reaction chamber.

To achieve the above object, in another aspect, the present invention provides a thin film deposition apparatus having a reaction chamber for forming a thin film on a plurality of substrates rested on a susceptor. The apparatus of the invention comprises: a gas supply means for supplying a plurality of gases to the inside of the reaction chamber from the outside, the gases including a reaction gas; a gas distribution means for distributing and spraying the gases supplied from the gas supply means so as to conform to the purpose of a process; a gas retaining means having a plurality of reaction cells for partitionally accommodating and retaining the respective gases distributed from the gas distribution means; a rotation driving means for rotating the susceptor such that the gases retained in the respective reaction cells are exposed to the substrates in sequence; and a gas exhaust means for pumping the gases retained by the gas retaining means to the outside of the reaction chamber.

As described above, according to the thin film deposition apparatus and method of the invention, the respective gases required for depositing a thin film are continuously supplied and exhausted simultaneously, and the substrates are exposed in sequence to the gases continuously supplied to the inside of the reaction cell, which has a minimal reaction space, thereby forming a thin film. Therefore, durability of the apparatus and productivity can be significantly improved, without repeated operation of valves for supplying and shutting down the gases.

In addition, according to the present invention, plasma excitation and radicalization for the reaction gases are performed with respect to the gases continuously supplied, and thus the operating time points do not need to be controlled. Therefore, a high quality thin film can be formed under stable processing conditions.

The present invention having the above features is divided into a reaction cell rotation model and a susceptor rotation mode. In the reaction cell rotation mode, while a gas retainer means is rotated, gases retained in a reaction cell are exposed sequentially to a substrate on a fixed susceptor. In the susceptor rotation mode, while a susceptor is rotated, gases retained in a fixed reaction cell are exposed sequentially to a rotating substrate. Both modes are operated by the same principle, and thus hereafter the invention will be explained, referring to embodiments according to the former.

In addition, the present invention may be applied to a common chemical vacuum vapor deposition apparatus. But, when it is applied to an atomic layer deposition apparatus, the features become clearer. For the convenience of explanation, the present invention will be described, referring to an atomic layer deposition apparatus using two reaction gases and one purge gas. In addition, the atomic layer deposition apparatus according to an embodiment of the invention is divided into a layered behavior type and a shower head type, depending on the flowing direction of gases supplied onto the substrate. Hereinafter, the former is explained and the latter will be explained with respect to differences from the former.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

The preferred embodiments of the invention will be hereafter described in detail, with reference to the accompanying drawings.

Figure 1:
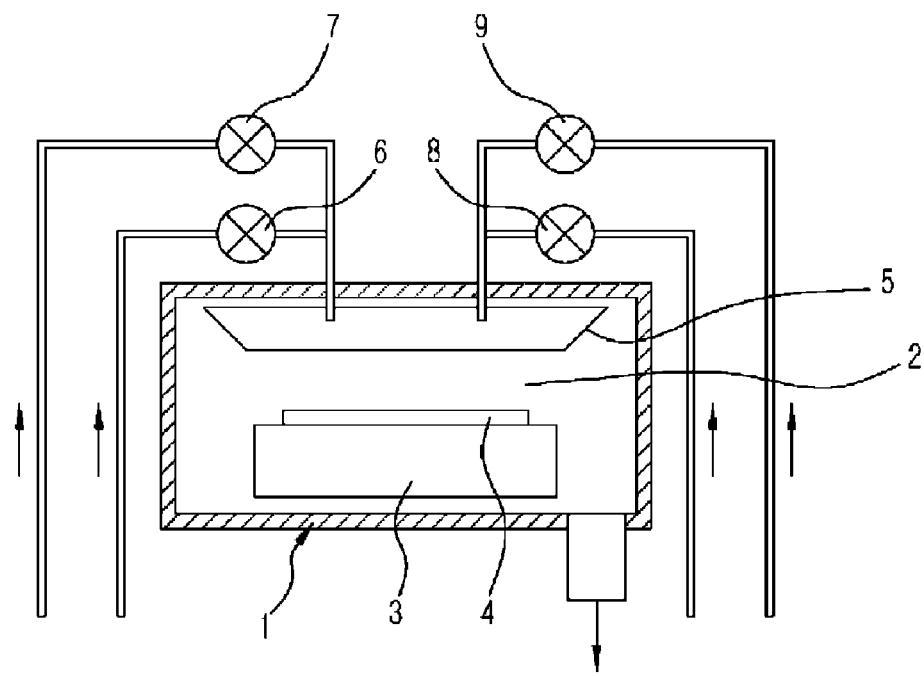
FIG. 1 is a schematic diagram showing the structure of a conventional shower head type atomic layer thin film deposition apparatus.
Figure 2:
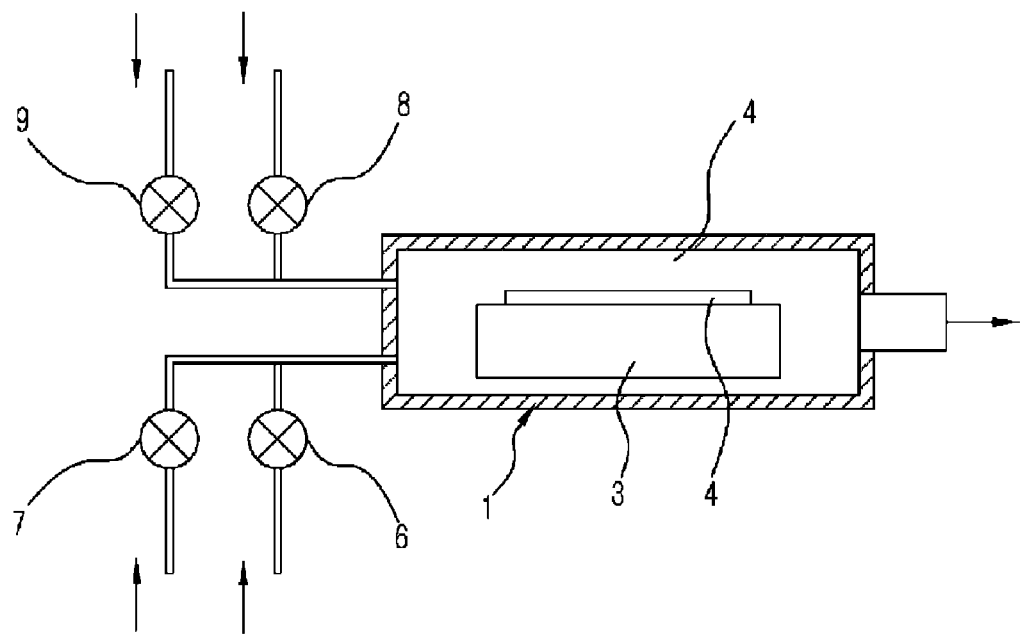
FIG. 2 is a schematic diagram showing the structure of a conventional layer behavior type atomic layer thin film deposition apparatus.
Figure 3:
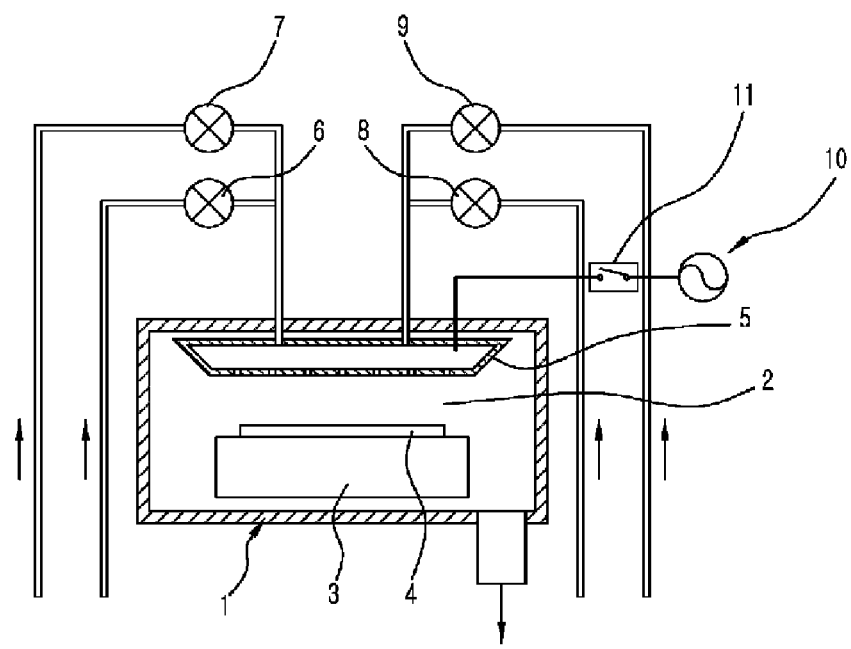
FIG. 3 is a schematic diagram showing the structure of FIG. 2 where a plasma excitation means is further provided.
Figure 4:
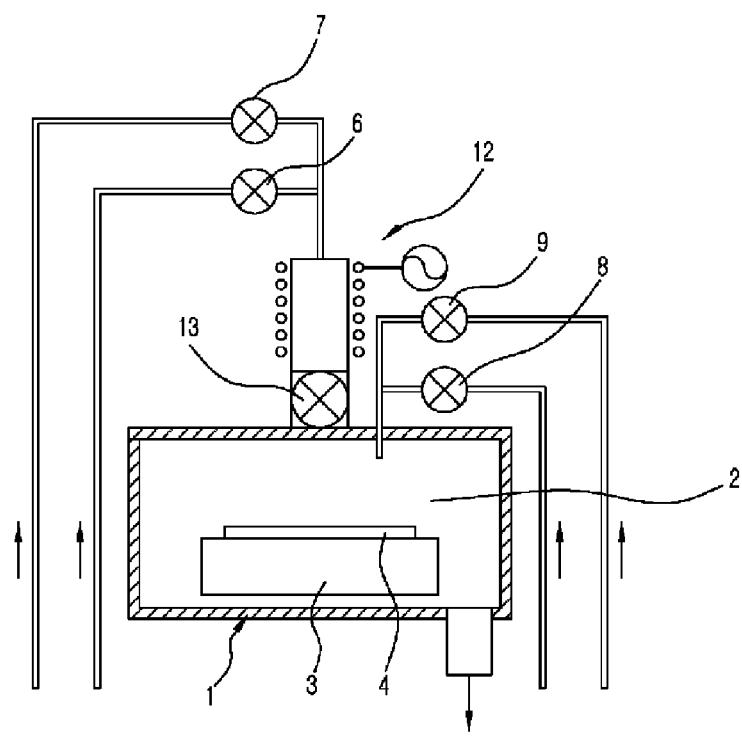
FIG. 4 is a schematic diagram showing the structure of FIG. 2 where a radical generator is further provided.
Figure 5:
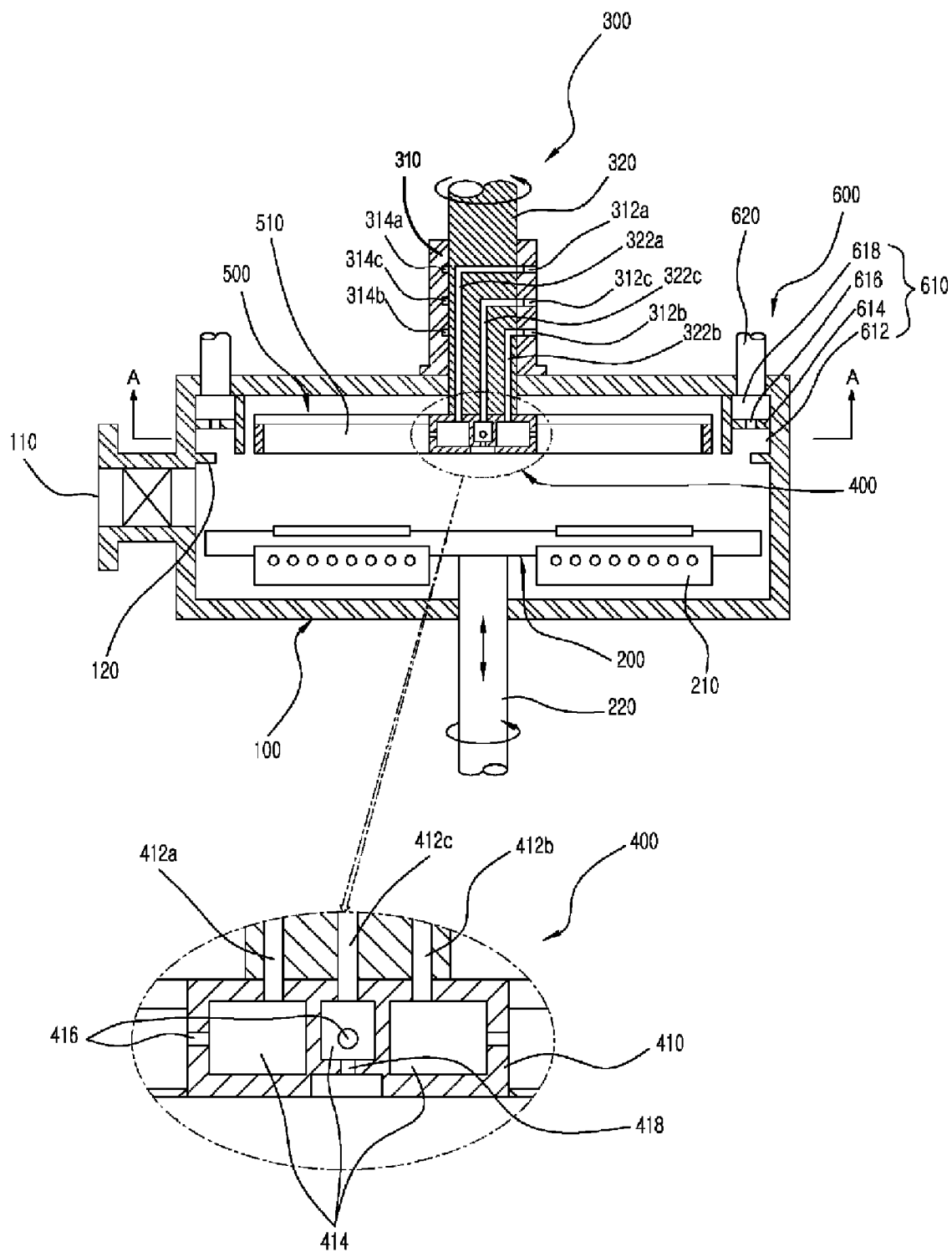
FIG. 5 is a schematic cross-section showing a thin film deposition apparatus according to an embodiment of the invention.

FIG. 5 is a schematic sectional view of a thin film deposition apparatus employing a rotary reaction cell mode and a layer behavior mode according to an embodiment of the invention. As illustrated in FIG. 5, a substrate entrance and exit 110 is formed at a side of a reaction chamber 100, and a heater 210 for heating a substrate is installed in a susceptor, on which a plurality of substrates supplied through the substrate entrance and exit 110 is rested. The susceptor having the above construction ascends and descents, and rotates by means of a susceptor rotation shaft 220, which is connected to the lower portion of the susceptor 200 in order to load and unload a substrate. This construction is well known, and thereinafter new features of the invention will be described in detail.

First, referring to FIG. 5, a gas supply means 300 is provided. In the gas supply means 300, a cylindrical supply main body 310 is air-tightly and fixedly installed in the upper center of the reaction chamber 100. Formed in the lateral side thereof are gas supply ports 312a, 312b and 312c for supplying a first reaction gas, a second reaction gas and a purge gas respectively. The respective gas supply ports 312a, 312b and 312c are connected respectively to annular grooves 314a, 314b and 314c formed in the inner peripheral face of the supply main body 310.

A rotation shaft 320 is inserted in the center of the supply main body 310. The rotation shaft 320 is rotated by means of an external rotational driver means (not shown).

The rotation shaft 320 is provided with gas passageways 322a, 322b and 322c formed vertical-downwardly thereinside so as to be fluid-communicated with the respective annular grooves 314a, 314b, and 314c, be extended to the inside of the reaction chamber 100, and be spaced apart from one another.

Therefore, the respective gases supplied from the lateral side of the supply main body 310 are provided to a gas distribution means 400 through the gas passageways 322a, 322b and 322c, even when the rotation shaft 320 rotates. The gas distribution means 400 is placed at the lower side of the supply main body 310.

Here, the supply main body 310 and the rotation shaft 320 are air-tightly coupled to each other through a sealing using a magnetic fluid or a mechanical sealing such as an Eric sealing method. Details thereon are well known and thus will not be described here.

On the other hand, as a rotational driver means (not shown) for rotationally driving the rotation shaft 320, a stepping motor is preferred, which has an encoder for controlling the rotation frequency and speed of a driving motor. The processing time for one cycle of a reaction cell 510 is controlled by means of the encoder.

Figure 7:
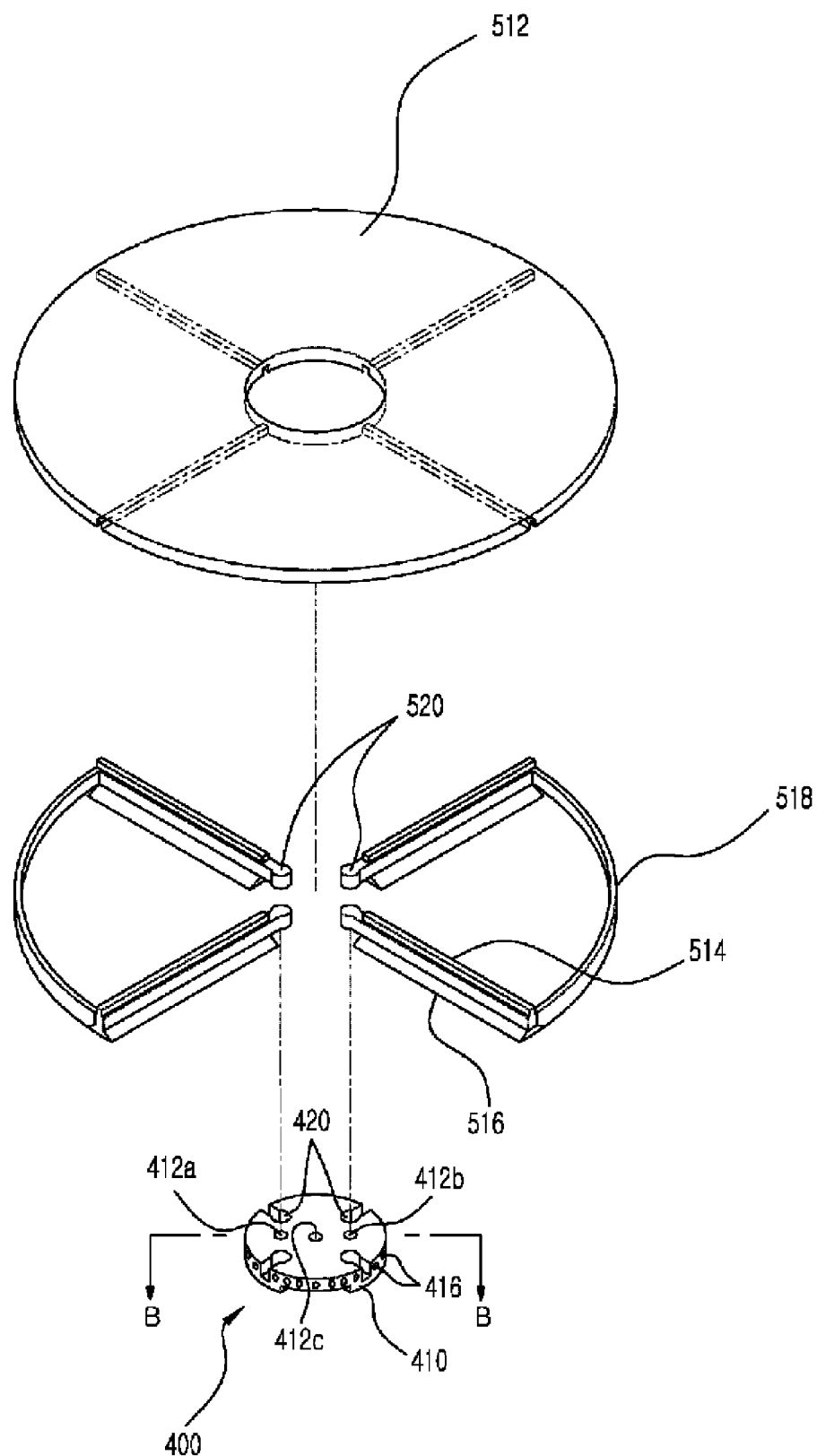
FIG. 7 is an exploded sectional view showing the structure of a reaction cell in FIG. 5.
Figure 8:
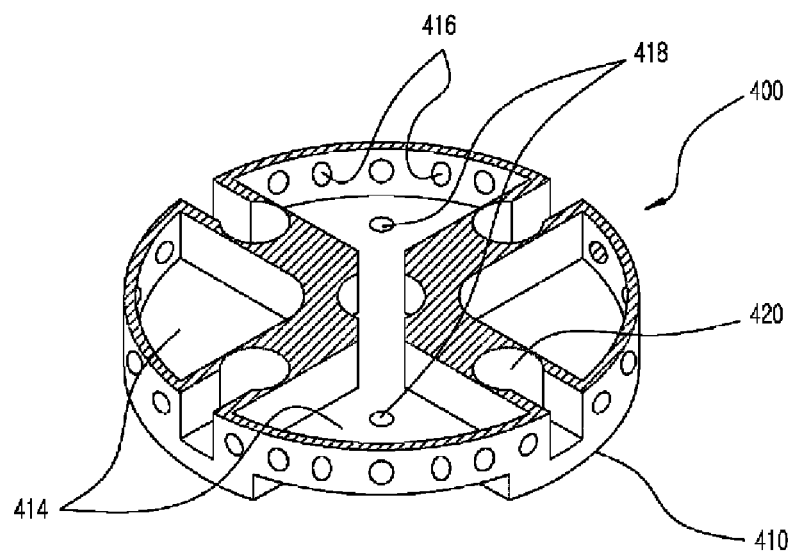
FIG. 8 is a schematic sectional view taken along the line B-B in FIG. 7, showing a gas distribution means.

Next, as shown in FIG. 5 (a partial detailed view), FIG. 7 and FIG. 8 (a perspective view showing a cross-section taken along the line B-B in FIG. 7), a distribution main body 410 constituting the gas distribution means 400 is fixed to the lower end of the rotation shaft 320 constituting the gas supply means 300. In the upper portion of the distribution main body 410, gas inlet ports 412a, 412b and 412c are formed to be connected to the respective gas passageways 322a, 322b and 322c. Inside the distribution main body 410, a plurality of distribution chambers 414 is formed to isolate the respective gases flowing in through the respective gas inlet ports 412a, 412b and 412c so as not to be mixed with each other.

At this time, the distribution main body 410 is formed in a circular plate having a certain desired thickness, but not limited thereto, may have various other shapes.

In addition, the distribution chamber 414 and the gas passageways 322c for supplying a purge gas are constructed so as to be fluid-communicated with each other, but the gas passageway 322c for supplying the purge gas may be divided such that the purge gas can be supplied to each individual distribution chamber 414.

The distribution chamber 414 is disposed around the center thereof adjacent to one another in the order of a first reaction gas, a purge gas, and the second reaction gas and the purge gas, and is installed, correspondingly to the reaction cell 510, which will be described hereinafter.

That is, the respective distribution chamber 414 is fluid-communicated with a lateral spray port 416 formed in the lateral face of the distribution main body 410 such that the respective gases flowing in through the gas supply port 312a, 312b and 312c can be sprayed to the reaction cell 510.

On the other hand, preferably, besides the lateral spray port 416, the distribution chamber 414, to which a purge gas is supplied, is provided with a downward spray port 418 formed at the lower portion thereof such that the gas can be sprayed vertical-downwardly. Thus, the sprayed gas serves as a gas curtain such that gases supplied inside the reaction cell 510 cannot be mixed with each other.

In the figures, the lateral spray port 416 and the downward spray port 418 are illustrated in the form of a hole, but not limited thereto, for example, may have the form of a slit opened along the outer peripheral face thereof.

Next, a gas retaining means 500 is formed of a plurality of reaction cells 510 in the periphery of the distribution main body 410. As shown in FIG. 7, each reaction cell 510 means a space partitioned by a plurality of partition walls 514, which are installed at regular intervals below a disk-shaped upper plate 512. The respective reaction cells 510 are supplied with gases distributed from the distribution chamber 414, which is formed inside the distribution main body 410.

The reaction cell 510 having the above-described construction can minimize the space substantially involved in the formation of a thin film on a substrate. Thus, the density of gas exposed to the substrate is increased, thus enabling a thin film deposition reaction in a short period of time, and also minimizing the amount of gas supplied.

The upper plate 512 functions to prevent the gas from being diffused upwardly and simultaneously to prevent formation of particle, which may be caused by accumulation of thin film on the top surface of the reaction chamber 100.

Here, the upper plate 512 may have various forms so as to conform to the purpose of process. For example, the upper plate 512 may have a circular disk form so as to block the top of the entire reaction cell 510. Alternatively, only the portion corresponding to the top of the upper plate 512 that a purge gas is supplied may be opened such that the purge gas can flow to the upper space of the reaction chamber 100.

Figure 6:
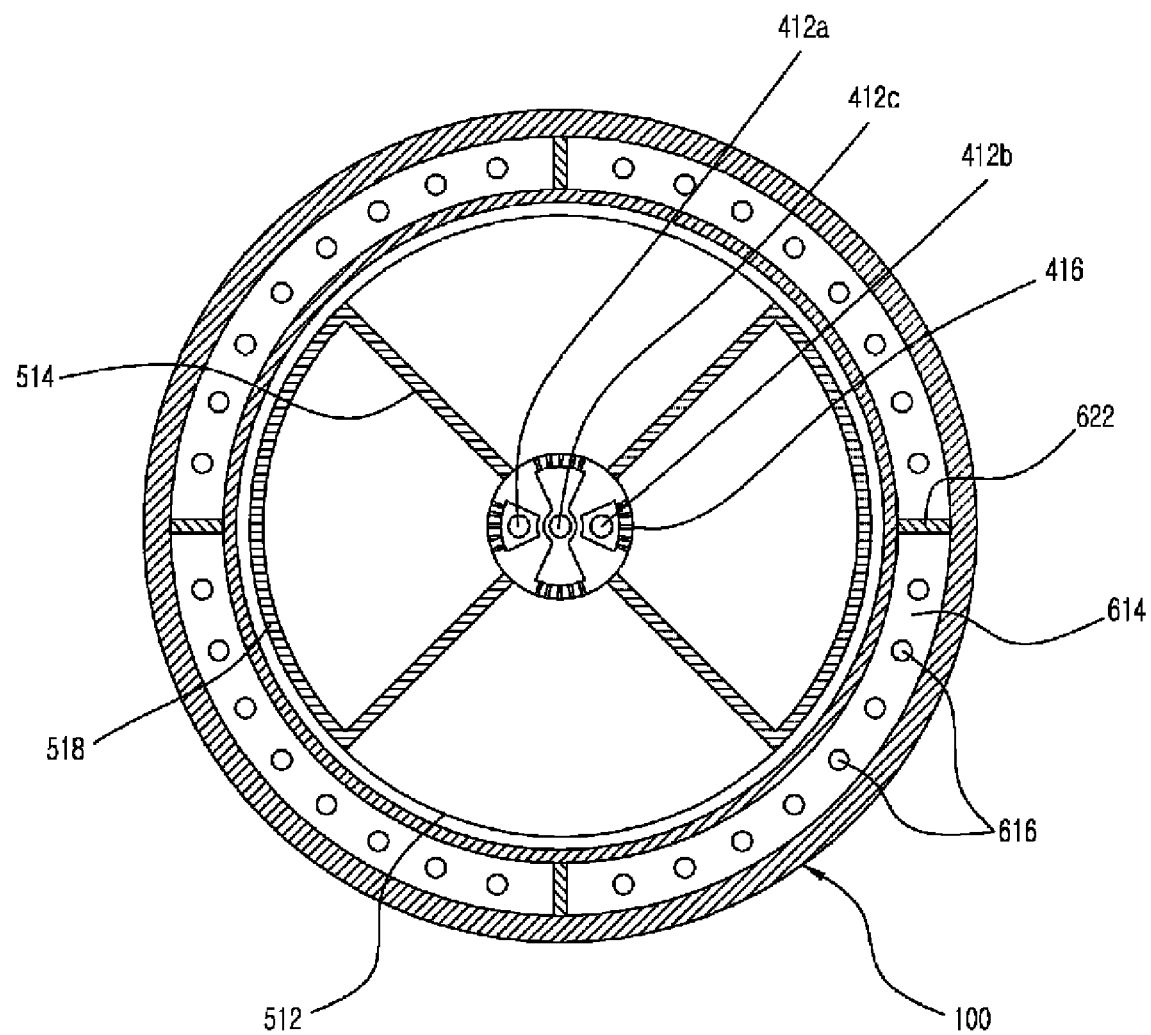
FIG. 6 is a schematic cross-section taken along the line A-A in FIG. 5.

In FIG. 6, four reaction cells 510 are formed at angular intervals of 90 degrees in the form of a fan, but not limited thereto. That is, depending on the purpose or characteristics of a process, eight reaction cells may be formed at angular intervals of 45 degrees or two reaction cells may be formed at angular intervals of 180 degrees. In addition, each reaction cell 510 may have a different size.

Each partition wall 514 is designed such that its direction corresponds to the lateral spray port 416 of the gas distribution means 400. According to an embodiment of the invention, the partition wall 514 is installed in a radial direction in the bottom face of the circular upper plate 512 so that the gas can flow in the radial direction. However, the invention is not limited to the above construction, but the partition wall 514 may be installed in various other ways. For example, although not illustrated in the drawings, the partition wall 514 may be installed in a spiral fashion so as to correspond to the rotation direction of the reaction cell 510, so that the gas can flow more uniformly.

In order to maximize the retaining time of internal gases, an outer peripheral wall 518 connecting the end portions of the partition wall is further installed in the outer periphery of the reaction cell 510.

According to the 'Langmuir principle' that is a single layer adsorption theory in the atomic layer deposition reaction, the surface adsorption rate for vapor-depositing an atomic layer thin film is determined in proportion to a partial pressure of the reaction gases and the exposure time thereof. The outer peripheral wall 518 functions to delay exhaust of the reaction gases to increase their partial pressures, and consequently the surface adsorption rate can be improved.

On the other hand, as illustrated in FIG. 7, in order to prevent the internal gases from being mixed between neighboring reaction cells 510, an extension plate 516 may be further provided in the lower end of the partition wall 514 formed to be extended in parallel to the susceptor 200.

The upper plate 512, the partition wall 514, the outer peripheral wall 518 and the extension plate 516 may be integrally formed or assembled to have the above-described construction. These are to be firmly connected to one another so as not to be separated by the centrifugal force of the reaction cell 510.

It is preferable that the spacing between the extension plate 516 and the substrate is as narrow as possible. However, in order to minimize gas mixing between the reaction cells 510, the above spacing is to be maintained to below at least 3 mm, but the extension plate 516 and the substrate must not contact each other.

The gas retaining means 500 having the above-described construction is fixed to the gas distribution means 400 so as to be integrally rotated therewith. According to an embodiment of the invention, as illustrated in FIG. 7, a plurality of connection grooves 420 is formed in the lateral side of the distribution main body 410, and a connection protrusion 520 having a shape corresponding to that of the connection groove is formed in one end portion of the partition wall 514. The connection groove 420 and the connection protrusion 520 are connected to each other so as not to be released from each other due to a centrifugal force. These connection means may be modified in various ways using a bolt or a clamp or the like.

On the other hand, although not illustrated in the drawings, a shower head type thin film deposition apparatus according to another embodiment of the invention has substantially the same configuration as the above-described layer behavior type thin film deposition apparatus, except for the structure of a gas retaining means.

That is, instead of the upper plate 512 constituting a gas retaining means 500 in the layer behavior type atomic layer deposition apparatus, the shower head type apparatus is provided with a desired space capable of accommodating the respective gases distributed from the gas distribution means 400, and may be provided with a plurality of shower heads for spraying the accommodated gases vertical-downwardly through a plurality of spray ports formed in the bottom face thereof.

Here, a plurality of partition walls 514 is formed in the bottom face of each shower head at regular intervals so as to form a reaction cell 510 corresponding thereto. Of course, the above-described outer peripheral wall 518 and extension plate 516 may be provided.

Therefore, the shower head type thin film deposition apparatus is operated in the same manner as the previous layer behavior type apparatus, except for the gas supply direction with respect to the substrate.

Next, as illustrated in FIG. 5, the gas exhaust means 600 is composed of a restriction plate 120 formed along the inner peripheral face of the reaction chamber 100 and a plurality of pumping cells 610 for exhausting the gases existing between the respective reaction cells 510.

Here, the restriction plate 120 prevents the reaction gases from flowing into a space below the susceptor 200, thus restricting the actual reaction space in the internal space of the reaction chamber 100.

Each pumping cell 610 is partitioned, correspondingly to the outer peripheral length of the reaction cell 510 so that different reaction gases cannot be sectioned simultaneously. In this way, particle formation can be avoided, which may be caused by mixing of gases due to simultaneous suction of a first reaction gas and the second reaction gas among the excessive gases flowing out from the respective reaction cells 510. That is, at a certain time point, gases suctioned to the pumping cell 610 must be one kind of reaction gas and a purge gas. Thus, in the case where four reaction cells 510 are provided, the length of each pumping cell 610 must be shorter than the peripheral length of the reaction cell 510. Of course, four or more reaction cells may be provided, while meeting the above conditions.

Referring to FIGS. 5 and 6, the structure of each pumping cell 610 will be explained in detail. Each pumping cell 610 includes a primary exhaust passageway 612 corresponding to a space between the upper portion of the restriction plate 120 and the periphery of the reaction cell 510, a separation plate 614 having a plurality of through-holes 616 formed thereabove, and a secondary exhaust passageway 618 formed thereabove and connected with an exhaust port 620. In this way, the exhaust passageways 612 and 618 are formed in a double structure and a separation plate 614 having a plurality of through-holes 616 is installed in-between. Thus, the gas flowing the whole outer peripheral area of the reaction cell 510 can have a uniform suction force.

The film deposition apparatus of the invention having the above-described construction may be provided with a plasma excitation means and a radical generation means. This construction differs from the conventional ones in that they are operated while a continuous gas supply is carried out.

First, the plasma excitation means is provided to at least one reaction cell 510, which is one supplied with a reaction gas, in such a way that an external RF power application device (not shown) is electrically connected thereto.

Specifically, the RF power application device is connected through the rotation shaft 320 with an electrical conductive member (not shown), which is attached to the bottom face of the upper plate 512, which corresponds to the top of a substrate in the reaction cell 510. In the case of the shower head type thin film deposition apparatus according to another embodiment of the invention, the RF power application device is connected with an electrical conductive member (not shown) attached to the bottom face of the shower head.

In order to continuously form gas plasma inside the reaction cell 510, the susceptor 200 is preferred to be formed of graphite materials or silicon carbide materials having an electrical conductance.

According to the above-described construction, the gas inside of a certain specific reaction cell 510 connected with the RF power application device remains in plasma-excited state, and, dissimilar to the conventional apparatuses, it is not necessary that plasma is excited every time when a specific gas is supplied.

Next, the radical generation means only have to radicalize at least one reaction gas among the gases supplied from the gas supply means 300, and the radicalized reaction gas is continuously supplied to the inside of the particular reaction cell 510.

On the other hand, the above-constructed plasma excitation means and radical generation means may be used separately or together, depending on the purpose of a process. The RF power application device and the radical generator (for example, Reactive Gas Generator manufactured by MKS Instruments Inc.) are well known to those skilled in the art and thus details thereon will not be described here.

Figure 9:
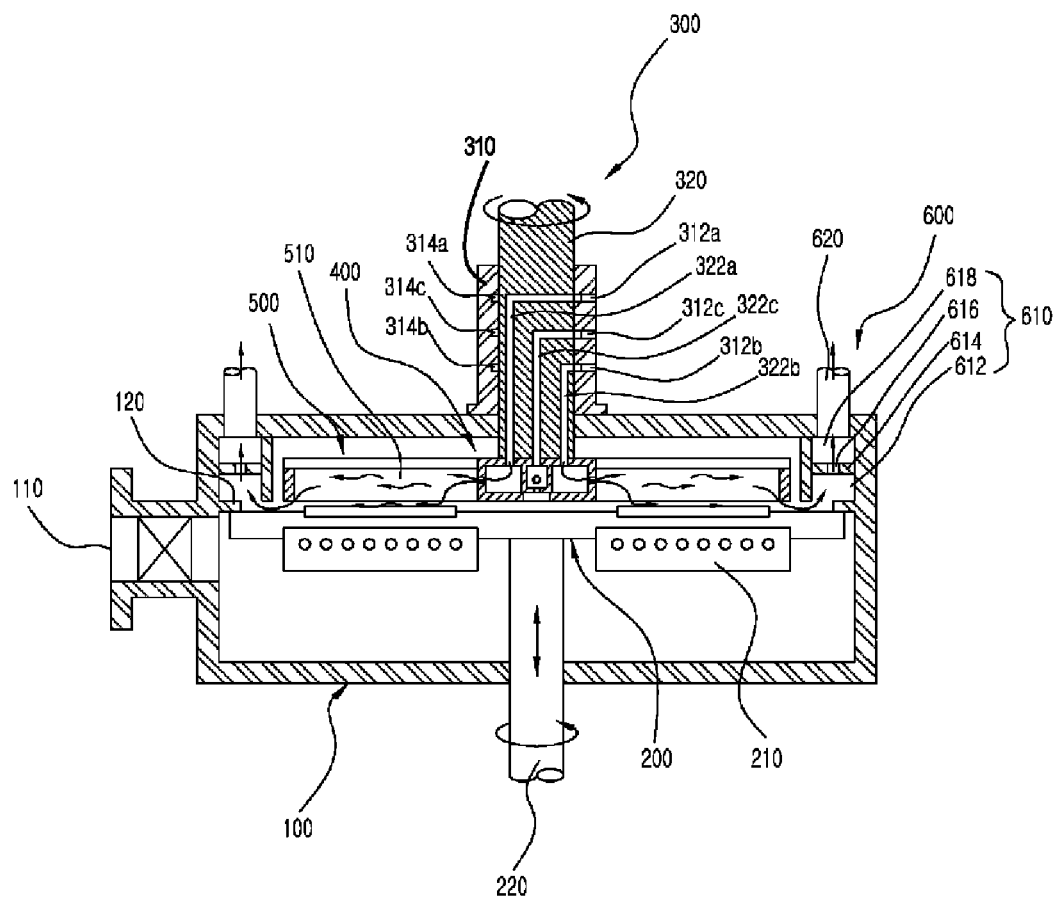
FIG. 9 is a schematic view showing the flow of reaction gas in a thin film deposition apparatus according to an embodiment of the invention.
Figure 10:
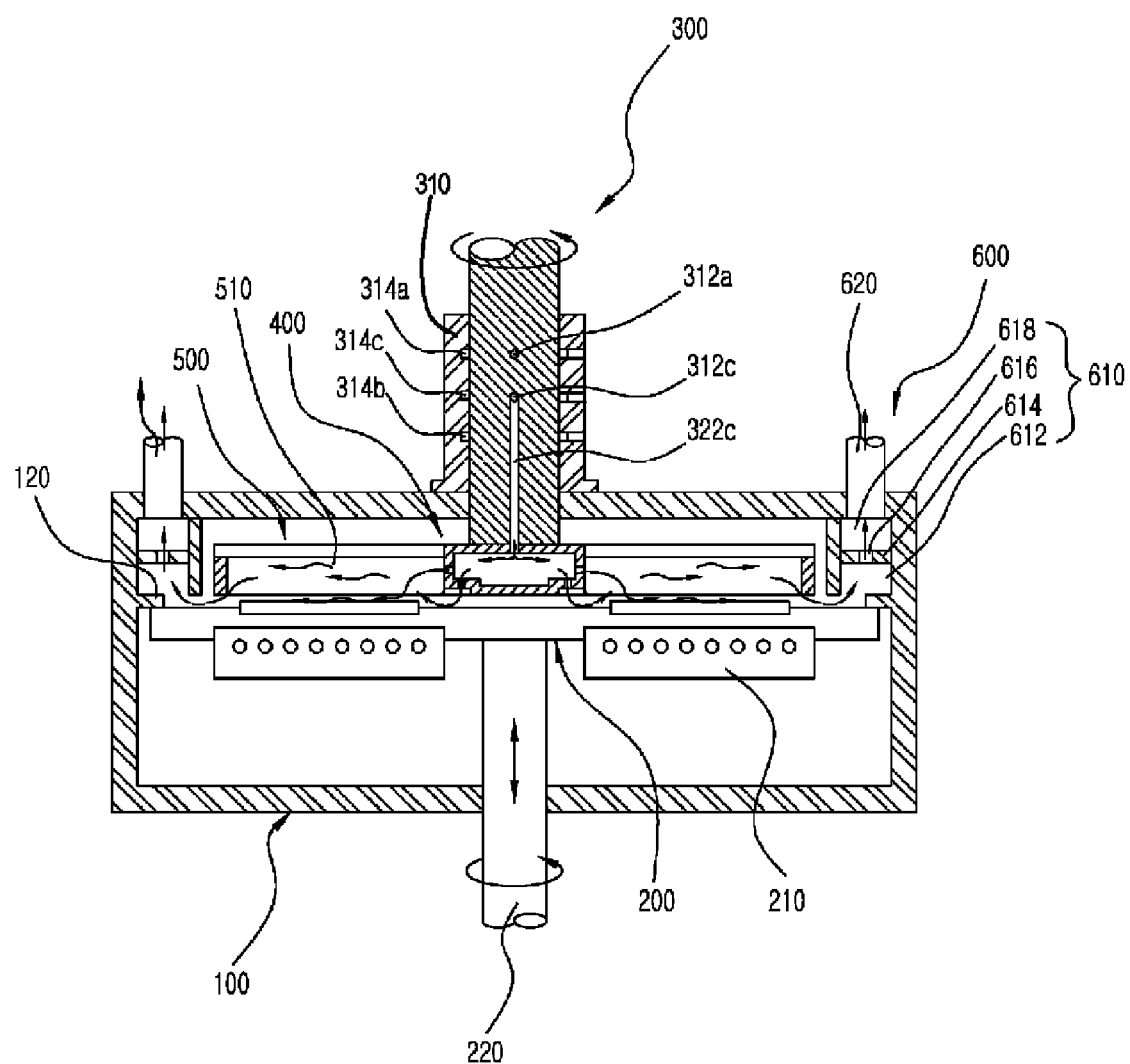
FIG. 10 is a schematic view showing the flow of purge gas in a thin film deposition apparatus according to an embodiment of the invention.

Hereinafter, with respect to the layer behavior deposition apparatus among the reaction cell rotary type apparatuses according to embodiments of the invention, a reaction gas flow and a purge gas flow in the thin film deposition process are specifically explained, referring to FIGS. 9 and 10.

(1) After a substrate is loaded in a desired place on a susceptor 200 by means of an external substrate transfer device (not shown), a plurality of substrates is loaded in sequence on the susceptor 200 while the susceptor rotation shaft 220 is rotated (S1).

(2) The susceptor 200 is lifted up to the restriction plate 120 of the reaction chamber 100 and the reaction cell 510 including a gas retaining means is placed above the substrate (S2).

At this state, the substrate is heated up to the temperature needed for reaction by means of a heater 210 installed below the susceptor 200.

(3) As the rotation shaft 320 inside the gas supply means 300 is rotated, the reaction cell including the gas distribution means 400 connected to the lower end of the rotation shaft 320 and the gas retaining means is simultaneously rotated (S3).

(4) A first and second reaction gases and a purge gas are supplied from the outside through gas supply ports 312a, 312b and 312c formed in the gas supply means 300. The supplied gases is provided to the gas distribution means 400 via the annular grooves 314a, 314b and 314c and the gas passageways 322a, 322b and 322c in sequence (S4).

At this time, it is preferable that at least one reaction gas is radicalized by means of a radical generation means before passing the relevant supply port (S8).

On the other hand, the above steps (3) and (4) may be switched, or performed simultaneously, or performed at regular time intervals, depending on the operation conditions.

(5) The respective gases flowing the respective gas passageways 322a, 322b and 322c are supplied to the inside of the distribution chamber 414 through the gas inlet ports 412a, 412b and 412c of the distribution main body 410. The gases are then sprayed to the corresponding reaction cell 510 through the lateral spray port 416 (S5).

On the other hand, as another embodiment of the invention, in the case of using the shower head type thin film deposition apparatus, the gases are supplied to the inside of the reaction cell 510 through a plurality of spray ports formed in the bottom face of the shower head.

At this time, an electric power is applied through an external RF power application device electrically connected to the corresponding face of the relevant reaction cell 510 corresponding to the top of the substrate, and thus the reaction gas inside the relevant reaction cell 510 is preferably plasma-excited (S8). (6) The respective gases supplied as above are retained in the reaction cell 510. At this time, the substrate rested on the rotating susceptor 200 is exposed to the retained gas and thus a thin film is deposited thereon (S6).

Specifically, explaining referring to anyone of the stopped substrate, as the reaction cell 510 is rotated, the substrate is exposed to the first reaction gas, the purge gas, the second reaction gas, the purge gas, and the first reaction gas repeatedly in sequence. That is, while the reaction cell 510 rotates one cycle, all the substrates on the susceptor 200 experience one cycle of gas exposure, and thus forming a primary thin film.

Thus, the rotation frequency of the reaction cell 510 is the same as the cycle number of the atomic layer deposition. Therefore, since the deposition thickness per one cycle is uniform, the entire thickness of the atomic layer thin film can be adjusted by controlling the rotating frequency of the reaction cell 510.

(7) The excessive gas not involved in the reaction and the purge gas are exhausted to the inner peripheral face of the reaction chamber 100 and the outer periphery of the reaction cell 510 by means of the respective pumping cell 610 (S7).

Specifically, with respect to each pumping cell 610, the gas is exhausted to the outside through the primary exhaust passageway 612, the through-hole 616 formed in the separation plate 614, the secondary exhaust passageway 618 and the exhaust port 620.

At this time, the respective pumping cells 610 are partitioned to the length corresponding to the outer peripheral length of the reaction cell 510. Thus, it is preferable that the first and second reaction gases are not suctioned simultaneously. If the length of the pumping cell 610 is larger than the spacing of the outer periphery of the reaction cell 510, different reaction gases may be suctioned through an identical exhaust port 620. In this case, the reaction gases may be reacted with each other to form particles, thus degrading the surface characteristics of formed thin films.

(8) In the above process, the steps (3) to (7) are repeated continuously until a thin film of a desired thickness is formed. Upon completion of the deposition process, the substrate entrance and exit 110 is opened and then the substrates on the susceptor 200 are withdrawn in sequence using a substrate transfer device (not shown). This operation is performed in a reverse order of the substrate loading operation.

In order to carry out a process for forming a binary thin film such as $SiO_2$, $Si_3N_4$, $HfO_2$, $Al_2O_3$, or TiN, at least four reaction cells 510 must be provided. A first reaction gas, a purge gas, a second reaction gas, and a purge gas must be supplied to each neighboring reaction cells 510 in the described order.

For example, the following table 1 summarizes gases supplied to each of the four reaction cells in order to form a binary thin film.

TABLE 1

Gases supplied to reaction cells for formation of binary thin film

| Binary thin film | Reaction cell 1 | Reaction cell 2 | Reaction cell 3 | Reaction cell 4 |
|---|---|---|---|---|
| $SiO_2$ | One of $SiH_2Cl_2$, $SiH_4$, $Si_2Cl_6$, $(CH_3)_4Si$, $(C_2H_5)_4Si$) | Inert gas (Ar, $N_2$, Xe, etc.) | One of $H_2O$, $O_2$, $O_3$, $N_2O$ | Inert gas (Ar, $N_2$, Xe, etc.) |
| $Si_3N_4$ | $SiH_2Cl_2$ | Inert gas (Ar, $N_2$, Xe, etc.) | $NH_3$ or plasma-formed $NH_3$ | Inert gas (Ar, $N_2$, Xe, etc.) |
| $HfO_2$ | $HfCl_4$ | Inert gas (Ar, $N_2$, Xe, etc.) | One of $O_2$, $O_3$, $H_2O$ | Inert gas (Ar, $N_2$, Xe, etc.) |

TABLE 1-continued

Gases supplied to reaction cells for formation of binary thin film

| Binary thin film | Reaction cell 1 | Reaction cell 2 | Reaction cell 3 | Reaction cell 4 |
|---|---|---|---|---|
| $Al_2O_3$ | $Al(CH_3)_3$ | Inert gas (Ar, $N_2$, Xe, etc.) | One of $O_2$, $O_3$, $H_2O$ | Inert gas (Ar, $N_2$, Xe, etc.) |
| TiN | $TiCl_4$ | Inert gas (Ar, $N_2$, Xe, etc.) | $NH_3$ | Inert gas (Ar, $N_2$, Xe, etc.) |

Referring to the above table, a deposition process for vapor-depositing TiN film will be explained. With respect to one of the substrates, first, $TiCl_4$ is adsorbed on the substrate by means of the rotating reaction cell 1. Thereafter, excessive $TiCl_4$ reaction gas except for a single layer is removed by the purge gas of the reaction cell 2, and then if exposed to $NH_3$ reaction gas by the reaction cell 3, TiN single film is formed by the atomic layer thin film deposition reaction. Next, a purge gas of the reaction cell 4 removes by-products and excessive $NH_3$ reaction gas, thereby completing one cycle process. This one cycle of process is performed in the same manner for all the substrates on the susceptor 200.

On the other hand, in order to form a composite (hybrid) layer of two kinds of binary thin films, for example, a composite layer of $Al_2O_3$ and $HfO_2$, at least eight reaction cells 510 must be provided, and a reaction cell, to which a purge gas is supplied, must be disposed between the reaction cells 510, to which a reaction gas is supplied.

That is, $Al(CH_3)_3$ must be supplied to the reaction cell 1, an inert gas (Ar, $N_2$, Xe, etc) must be supplied to the reaction cell 2, one of $O_2$, $O_3$, $H_2O$ must be supplied to the reaction cell 3, an inert gas (Ar, $N_2$, Xe, etc.) must be supplied to the reaction cell 4, $HfCl_4$ must be supplied to the reaction cell 5, an inert gas (Ar, $N_2$, Xe, etc.) must be supplied to the reaction cell 6, one of $O_2$, $O_3$, $H_2O$ must be supplied to the reaction cell 7, and an inert gas (Ar, $N_2$, Xe, etc.) must be supplied to the reaction cell 8.

As described above, according to the thin film deposition apparatus and method of the invention, the respective gases required for depositing a thin film are continuously supplied and exhausted simultaneously, and the substrates are exposed in sequence to the gases continuously supplied to the inside of the reaction cell, which has a minimal reaction space, thereby forming a thin film. Therefore, durability of the apparatus and productivity can be significantly improved, without repeated operation of valves for supplying and shutting down the gases.

In addition, according to the present invention, plasma excitation and radicalization for the reaction gases are performed with respect to the gases continuously supplied, and thus the operating time points do not need to be controlled. Therefore, a high quality thin film can be formed under stable processing conditions.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A thin film deposition apparatus having a reaction chamber for forming a thin film on a plurality of substrates rested on a susceptor, the apparatus comprising:

a gas supply means for supplying a plurality of gases to the inside of the reaction chamber from the outside, the gases including a reaction gas;

a gas distribution means for distributing and spraying the gases supplied from the gas supply means so as to conform to the purpose of a process;

a gas retaining means for partitionally accommodating and concurrently retaining the gases distributed from the gas distribution means, the gas retaining means comprising:
an upper plate having a bottom face; and
a plurality of partition walls protruding from the bottom face and installed at regular intervals below the bottom face, such that the partition walls define therebetween a plurality of reaction cells below the upper plate, alls wherein the partition walls are configured so as to increasingly broaden the width of the reaction cells from the inside to the outside of the gas retaining means and to partitionally accommodate and concurrently retain the respective gases distributed from the gas distribution means wherein the partition wall is further provided, at both lower end sides thereof, with an extension plate extended in parallel to the susceptor, so that gas mixing between neighboring reaction cells is restricted;

a rotation driving means for rotating selectively one of the gas retaining means and the susceptor such that the gases concurrently retained in the respective reaction cells are exposed to the substrates in sequence; and a gas exhaust means for pumping the gases retained by the gas retaining means to the outside of the reaction chamber;

wherein the gas distribution means further comprises a fixing means for fixing the as retaining means;

a distribution main body inserted into the central portion of the upper plate and closely contacting the respective partition walls;

a gasinlet ports formed in the distribution main bodysuch that gases supplied from the gas supply means are individually introduced;

a distribution chamber fluid-communicated with the gas inlet ports and having a desired space formed therein for partitionally accommodating the respective gases; and a plurality of lateral spray ports formed in the later face of the distribution main body such that the gases accommodated in the distribution chamber are sprayed to the lateral faces of the respective reaction cells.

2. The apparatus of claim 1, wherein the gas retaining means is connected at its central portion with the lower end of the gas distribution means, and the reaction cell being integrally rotated together with the gas distribution means.

3. The apparatus of claim 1, wherein the gas supply means supplies at least two or more reaction gases and a purge gas.

4. The apparatus of claim 1, wherein the upper plate has the form of a circular plate, and the respective partition walls are installed in a radial direction.

5. The apparatus of claim 1, wherein the upper plate has the form of a circular plate, and the respective partition walls are installed in a spiral form.

6. The apparatus of claim 1, wherein among the reaction cells, a reaction cell requiring an extension of gas retaining time is further provided at its periphery with an outer peripheral wall connecting the end portions of the partition walls.

7. The apparatus of claim 1, wherein the spacing between the extension plate and the substrate is maintained below 3 mm while not contacting each other.

8. The apparatus of claim 1, wherein the rotation driving means has a rotation frequency from 30 to 180 rpm.

9. The apparatus of claim 1, wherein, among the distribution chambers, a distribution chamber accommodating a purge gas is further provided with a downward spray port formed in the bottom face of the distribution main body, along with the lateral spray port, such that the purge gas can be sprayed vertical-downwardly.

10. The apparatus of claim 1, wherein the fixing means further comprises:
a plurality connection grooves formed in the distribution main body; and
a connection protrusion formed in on end portion of the respective partition walls so as to be inserted and connected into the connection groove.

11. The apparatus of claim 1, wherein among the distribution chamber, distribution chambers, to which identical gases are supplied, are fluid-communicated with each other.

12. The apparatus of claim 1, wherein the gas retaining means further comprises:
a shower head divided in plural such that gases distributed from the gas distribution means are sprayed vertical-downwardly through a plurality of spray ports formed in the bottom face thereof; and
a plurality of partition walls formed at regular intervals in the bottom face of the shower head such that a plurality of reaction cells are formed correspondingly to the respective shower heads.

13. The apparatus of claim 12, wherein the gas distribution means further comprises:
a fixing means for fixing the gas retaining means;
a distribution main body having the form of a circular plate and inserted into the central portion of the shower head;
a plurality of gas inlet ports formed in the distribution main body such that gases supplied from the gas supply means are individually introduced;
a distribution chamber fluid-communicated with the gas inlet ports and having a desired space for partitionally accommodating the respective gases; and
a plurality of lateral spray ports formed in the later face of the distribution main body such that the gases accommodated in the distribution chamber are sprayed to partitioned spaces of the inside of the shower head.

14. The apparatus of claim 1, wherein a restriction plate is installed in such a way as to be protruded along the inner peripheral face of the reaction chamber so as to be closely contacted with the upper periphery of the susceptor when it ascends, and the gas exhaust means is installed such that gas in a space between the inner peripheral face of the upper space of the reaction chamber and the outer periphery of the reaction cell can be pumped through an exhaust port, the reaction chamber being restricted by the ascending susceptor.

15. The apparatus of claim 14, wherein the gas exhaust means further comprises:
a plurality of pumping cell partitioned to no more than the peripheral length of the reaction cell; and
an exhaust pump for pumping gases through an exhaust port connected with the respective pumping cells.

16. The apparatus of claim 15, wherein the pumping cell further comprises:
a primary exhaust passageway formed in a space above the restriction plate;
a separation plate having a plurality of through-holes formed above the primary exhaust passageway; and
a secondary exhaust passageway formed in a space above the separation plate and connected with the exhaust port.

17. The apparatus of claim 1, further comprising a radical generating means for radicalizing one or more reaction gas among the gases supplied from the gas supply means.

18. The apparatus of claim 1, wherein among the reaction cells, at least one reaction cell, to which a reaction gas is supplied, is further provided with a plasma excitation means for plasma-exciting a reaction gas inside the reaction cell, the plasma excitation means being electrically connected with an external RF power application device at the face thereof corresponding to the upper portion of the substrate.

* * * * *